US007686885B2

(12) United States Patent
Ku et al.

(10) Patent No.: US 7,686,885 B2
(45) Date of Patent: Mar. 30, 2010

(54) PATTERNED NANOROD ARRAYS AND METHODS OF MAKING SAME

(75) Inventors: Anthony Yu-Chung Ku, Niskayuna, NY (US); Reed Roeder Corderman, Niskayuna, NY (US); Krzysztof Slowinski, Long Beach, CA (US)

(73) Assignee: General Electric Company, Niskayuna, NY (US)

( * ) Notice: Subject to any disclaimer, the term of this patent is extended or adjusted under 35 U.S.C. 154(b) by 469 days.

(21) Appl. No.: 11/142,799

(22) Filed: Jun. 1, 2005

(65) Prior Publication Data
US 2006/0275955 A1    Dec. 7, 2006

(51) Int. Cl.
*C30B 21/02*    (2006.01)
(52) U.S. Cl. .............................. 117/89; 117/94; 117/95; 117/96; 117/101
(58) Field of Classification Search .................... 117/89, 117/94, 95, 96, 101
See application file for complete search history.

(56) References Cited

U.S. PATENT DOCUMENTS

2005/0060884 A1 * 3/2005 Okamura et al. ............... 29/846

OTHER PUBLICATIONS

Hideki Masuda et al., "*Ordered Metal Nanohole Arrays Made By A Two-Step Replication of Honeycomb Structures of Anodic Alumina*", Science, vol. 268, pp. 1466-1468, 1995.

Hideki Masuda et al., "*Highly Ordered Nanochannel-Array Architecture In Anodic Alumina*", American Institute of Physics, Applied Physics Letters, vol. 71, No. 19, pp. 2770-2772, 1997.
I. Zhitomirsky et al., "*Electrolytic PZT Films*", Journal of Materials Science, vol. 32, pp. 803-807, 1997.
O. Jessensky et al., "*Self-Organized formation of Hexagonal Pore Arrays In Anodic Alumina*", American Institute of Physics, Applied Physics Letters, vol. 72, No. 10, pp. 1173-1175, 1998.
A. J. Yin et al., "*Fabrication of Highly Ordered Metallic Nanowire Arrays By Electrodeposition*", American Institute of Physics, Applied Physics Letters, vol. 79, No. 7, pp. 1039-1041, 2001.
Dhaval A. Doshi et al., "*Optically Defined Multifunctional Patterning of Photosensitive Thin-Film Silica Mesophases*", Science, vol. 290, pp. 107-111, 2000.
Franklin Kim et al., "*Langmuir—Blodgett Nanorod Assembly*", J. Am. Chem. Soc., vol. 123, pp. 4360-4361, 2001.
Maojun Zheng et al., "*Fabrication and Structural Characterization of Large-Scale Uniform $SnO_2$ Nanowire Array Embedded In Anodic Alumina Membrane*", American Chemical Society, Chem. Mater., vol. 13, pp. 3859-3861, 2001.
Erich D. Steinle et al., "*Ion Channel Mimetic Micropore and Nanotube Membrane Sensors*", American Chemical Society, Anal. Chem., vol. 74, pp. 2416-2422, 2002.

(Continued)

*Primary Examiner*—Robert M Kunemund
(74) *Attorney, Agent, or Firm*—Paul J. DiConza

(57) ABSTRACT

In some embodiments, the present invention addresses the challenges of fabricating nanorod arrays comprising a heterogeneous composition and/or arrangement of the nanorods. In some embodiments, the present invention is directed to multicomponent nanorod arrays comprising nanorods of at least two different chemical compositions, and to methods of making same. In some or other embodiments, the nanorods are spatially positioned within the array in a pre-defined manner.

28 Claims, 14 Drawing Sheets

OTHER PUBLICATIONS

Juchao Yan et al., *Growth of Patterned Nanopore Arrays of Anodic Aluminum Oxide:*, Advanced Materials, vol. 15, No. 23, pp. 2015-2018, 2003.

Zhengrong R. Tian et al., *"Complex and Oriented ZnO Nanostructures"*, Nature Materials, Articles, vol. 2, pp. 821-826, 2003.

Conghua Lu et al., *Au Nanoparticle Micropatterns Prepared From Self-Assembled Films*, American Chemical Society, Langmuir, vol. 20, pp. 974-977, 2004.

Kovtyukhova et al., "Layer-by-Layer Assembly of Rectifying Junctions In and On Metal Nanowires", J. Phys. Chem. B, vol. 105, pp. 8762-8769, 2001.

* cited by examiner

PATTERNED NANOROD ARRAYS AND METHODS OF MAKING SAME

TECHNICAL FIELD

The present invention relates generally to nanorod arrays, and more specifically to multicomponent nanorod arrays comprising nanorods of at least two different chemical compositions.

BACKGROUND INFORMATION

From a materials standpoint, the current state of nanorod arrays includes two general pathways for making the arrays. In the first, free-standing nanorods are grown through a variety of chemical methods and subsequently attached to a substrate in the desired configuration. See Kim et al., J. Am. Chem. Soc., 2001, 123, p. 4360. In the second, nanorods are grown directly on a substrate—either through seeded growth or inside a template using chemical or electrochemical deposition methods.

Regarding the use of templates in the second general above-mentioned pathway, growth of nanorods in nanoporous anodized aluminum oxide templates is now well established. See Masuda et al., Science, 1995, 268, p. 1466; Masuda et al., Appl. Phys. Lett., 1997, 71, p. 2770; Jessensky et al., Appl. Phys. Lett., 1998, 72(10), p. 1173; Yin et al., Appl. Phys. Lett., 2001, 79, p. 1039; and Zheng et al., Chem. Mater., 2001, 13, p. 3859.

Regarding seeded growth of nanorods in the second general above-mentioned pathway; as above, this too is well established (Tian et al., Nature Materials, 2003, 2, p. 821). Such seeded growth can even be used to generate patterned arrays (United States Patent Application Serial No. 20050009224).

Despite advances in creating nanorod arrays, existing methods for making such arrays are still directed to the formation of arrays of nanorods of essentially homogeneous composition. Methods to extend the compositional diversity of such arrays would be extremely useful in that they would provide for multicomponent nanorod arrays useful for a wide range of applications.

BRIEF DESCRIPTION OF THE INVENTION

In some embodiments, the present invention addresses the challenges of fabricating nanorod arrays comprising a heterogeneous composition and/or arrangement of the nanorods. In some embodiments, the present invention is directed to multicomponent nanorod arrays comprising nanorods of at least two different chemical compositions, and to methods of making same. In some or other embodiments, the nanorods are spatially positioned within the array in a pre-defined manner.

In some embodiments, the present invention is directed to a method comprising the steps of: (a) providing a substrate-supported template comprising a plurality of nanopores; (b) activating a first portion of the nanopores to yield a first portion of activated nanopores; (c) electrochemically-depositing a first material as nanostructures in the first portion of activated nanopores; (d) activating a second portion of the nanopores to yield a second portion of activated nanopores; and (e) electrochemically-depositing a second material as nanostructures in the second portion of activated nanopores to yield a multicomponent nanorod array comprising nanostructures of different chemical composition. Optionally, there can be a further step comprising an etching of the template to more fully expose the nanostructures formed within the nanopores. Typically, such nanostructures are nanorods.

Some methods of the present invention provide the ability to deposit nanorods of differing chemical composition, doping, diameter, and height, in a template with sub-micron pattern resolution. This is generally accomplished using a selective deposition technique in which some nanopores are filled first and the others are filled later. In some embodiments, such control can be accomplished, for example, by changing the pore wetting properties using a ultraviolet (UV)-patternable self-assembled monolayer (SAM)-degradation technique. In some or other embodiments, this can be accomplished by depositing the template on a patterned/addressable electrode array and selectively activating electrodes within the array during electrodeposition.

Embodiments of the present invention using the above-mentioned UV patterning technique are generally more flexible in the sense that pre-fabrication of electrodes under the template is generally not needed. Such methods are generally compatible with existing photolithographic patterning techniques. That is, UV radiation using a photolithographic mask should produce wettable pores in the template with resolution comparable to that of conventional lithography. Additionally, the use of a photomask in this manner permits a decoupling of the patterning and deposition steps.

In some embodiments, such multicomponent nanorod arrays are operable for use as thermoelectric devices. In some such embodiments, two types of rods are generally present: n- and p-type. By putting these rods next to each other, one can complete an electric circuit. Additional advantages in thermoelectric performance may be realized due to the 1-dimensional (1-D) structure of the nanorods typically involved.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
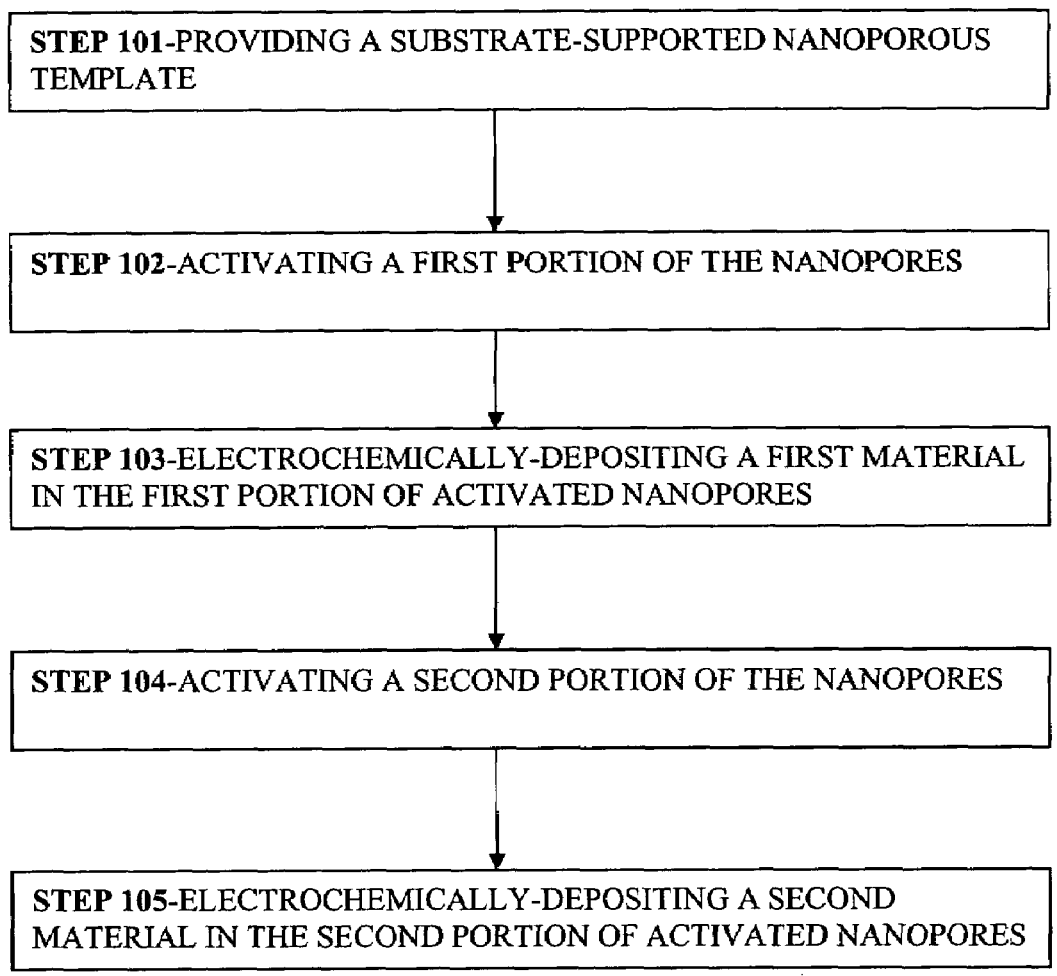
FIG. 1 is a flow diagram depicting methods of making multicomponent nanorod arrays, in accordance with embodiments of the present invention.

In some embodiments, the present invention is directed to multicomponent nanorod arrays comprising nanorods of at least two different chemical compositions. In some or other embodiments, the present invention is directed to methods of making such multicomponent nanorod arrays, wherein such methods involve the sequential activation of portions of nanopores within a nanoporous template and into which nanorods are electrochemically deposited, wherein such deposition is done simultaneously with, or subsequent to, pore activation. For these latter embodiments, two general methods of making such multicomponent nanorod arrays exist. The first method involves modifying the pore wettability of the template in a pre-defined manner (via photolithography). The second method involves selectively depositing nanorods on a patterned/addressable electrode array.

In the following description, specific details are set forth such as specific quantities, sizes, etc. so as to provide a thorough understanding of embodiments of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

Referring to the drawings in general, it will be understood that the illustrations are for the purpose of describing a particular embodiment of the invention and are not intended to limit the invention thereto.

A "nanostructure," as defined herein, is a structure being nanometer-sized in at least two dimensions. Exemplary such structures include, but are not limited to, nanoparticles, nanotubes, nanorods, nanowires, and the like. Generally, nanometer-sized is less than about 200 nm, and typically nanometer-sized is less than about 100 nm.

As defined herein, "1-dimensional nanostructures" are nanorods, nanotubes, or nanowires, having a diameter on the order of nanometers and an aspect ratio greater than about 10. Generally, the terms "nanorod" and "nanowire" are used interchangeably herein.

"Photolithography," as defined herein, is extended beyond its traditional definition (i.e., lithography involving visible light) to further include ultraviolet (UV) and near infrared (NIR) "light."

Referring to the flow chart in FIG. 1, in some embodiments, the present invention is directed to a method comprising the steps of: (Step 101) providing a substrate-supported template comprising a plurality of nanopores; (Step 102) activating a first portion of the nanopores to yield a first portion of activated nanopores; (Step 103) electrochemically-depositing a first material as nanorods in the first portion of activated nanopores; (Step 104) activating a second portion of the nanopores to yield a second portion of activated nanopores; and (Step 105) electrochemically-depositing a second material as nanorods in the second portion of activated nanopores to yield a multicomponent nanorod array comprising nanorods of different chemical composition. Optionally, there can be a further step comprising an etching of the template to more fully expose the nanorods formed within the nanopores.

Figure 2:
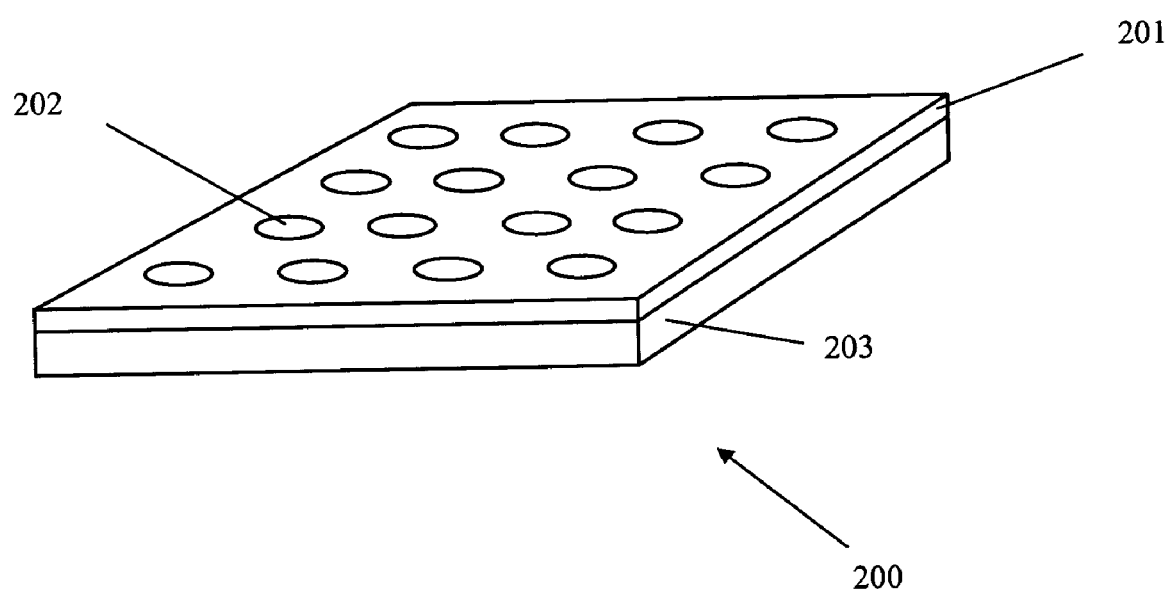
FIG. 2 depicts a substrate supported nanoporous template, in accordance with embodiments of the present invention.

In some of the above-described embodiments, the nanopores are uniformly arranged in the template. In some or other embodiments, the nanopores are arranged substantially perpendicular to the plane of the template. An exemplary nanoporous template is an anodized aluminum oxide (AAO) template. Nanopore diameter typically is in the range of about 15 nm to about 200 nm; nanopore depth is typically in the range of about 100 nm to about 100 μm; and pore density within the template is typically on the order of from about $10^8/cm^2$ to about $10^{12}/cm^2$. Novel methods of fabricating such AAO nanoporous templates using a sacrificial barrier layer (e.g., Ti) can be found in commonly assigned, co-pending U.S. patent application Ser. No. 11/141,613, filed May 27, 2005 and incorporated by reference herein, wherein the sacrificial barrier layer exists between the aluminum (Al) being anodized and the conductive layer on which the Al resides. Other suitable nanoporous templates include, but are not limited to, titania, polymers (polycarbonate, polyester), track-etched mica, and combinations thereof. FIG. 2 illustrates a substrate-supported nanoporous template 200, comprising a nanoporous layer 201 with nanopores 202 and residing on a substrate 203. Note that dimensions not drawn to scale. While the substrate material is not particularly limited, at least a top portion of the substrate is typically of sufficient conductivity such that it can function as an electrode surface during electrodeposition of nanorods from a precursor solution.

In some embodiments, referred to herein as "lithographic embodiments," the step of activating a first portion of the nanopores further comprises the sub-steps of: (a) coating the entire template with a photosensitive compound to form a coated template, such that the photosensitive compound coats all of the nanopores and renders them unwettable with a precursor solution used in the steps of electrochemically-depositing; and (b) exposing the first portion of nanopores within the coated template to a form of activating radiation by irradiating through a first photomask, wherein the activating radiation modifies the photosensitive compound and renders the exposed nanopores wettable with a precursor solution. In some such embodiments, the step of activating a second portion of the nanopores further comprises a sub-step of exposing the second portion of the nanopores to activating radiation. Precursor solutions generally comprise dissolved metal-containing salts and/or complexes that are suitable for being electrodeposited in accordance with embodiments of the present invention. Typically, such precursor solutions are aqueous, but the nature of the solvent is not particularly limited. "Photo-," as defined herein, involves radiation from the UV, visible, and NIR regions of the electromagnetic spectrum.

Figure 3:
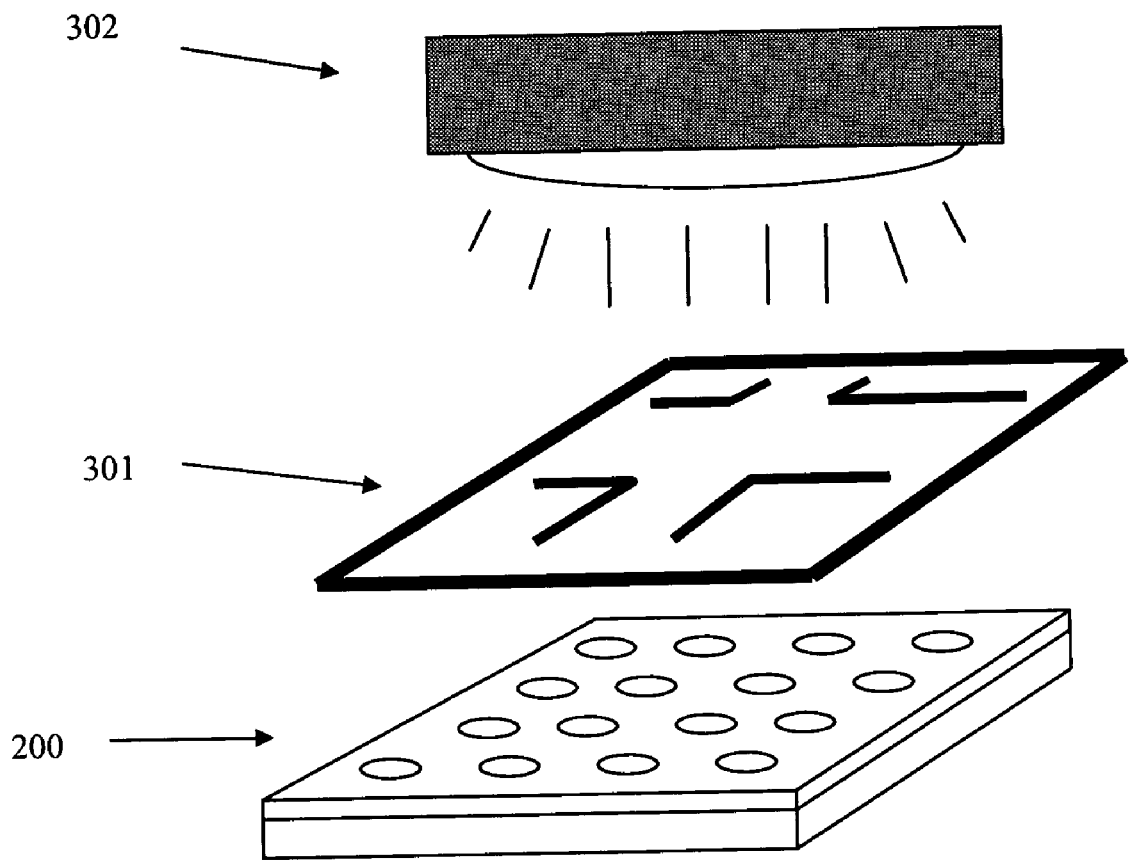
FIG. 3 depicts activation of coated nanopores via lithographic means, in accordance with some embodiments of the present invention.
Figure 4:
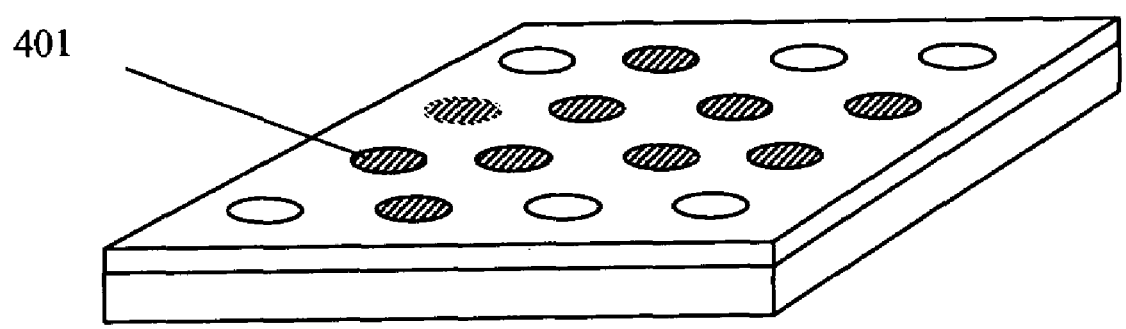
FIG. 4 depicts a nanoporous template after deposition of nanorods of a first material in a first portion of the nanopores, in accordance with some embodiments of the present invention.
Figure 5:
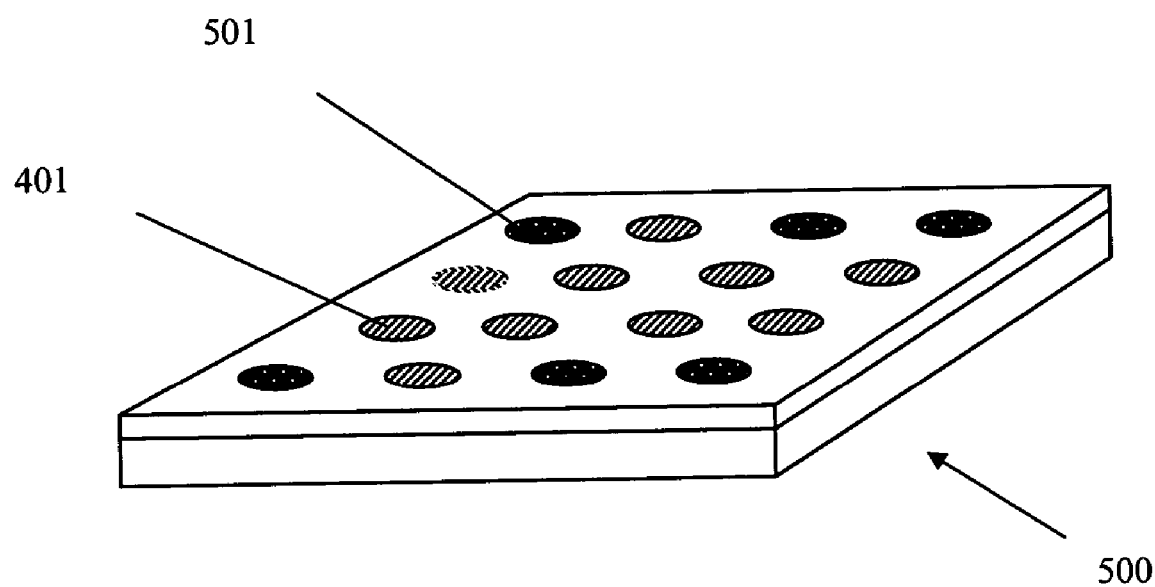
FIG. 5 depicts the nanoporous template of FIG. 4, after deposition of a second material in a second portion of the nanopores so as to yield a multicomponent nanorod array, in accordance with some embodiments of the present invention.

The above lithographic embodiments are illustrated in FIG. 3, where a substrate-supported nanoporous array 200 is coated with a photosensitive compound that renders all nanopores unwettable with nanorod precursor solution, a patterned photomask 301 is applied and unmasked nanopores are irradiated with a radiation source 302. Such irradiation-activated unmasked nanopores are wettable with nanorod precursor solution and a first material can be deposited in these nanopores as nanorods of a first material 401 (FIG. 4). Referring to FIG. 5, the remaining unactivated nanopores can then be activated by irradiation, and a second material can then be deposited into these nanopores as nanorods of a second material 501 and forming a multicomponent nanorod array 500 comprising nanorods of two different materials. Alternatively, additional photomasks could be used to sequentially activate specific regions, thereby leading to the formation of multicomponent nanorod arrays comprising nanorods of more than two different materials.

In some lithographic embodiments, the photosensitive compound comprises material selected from the group consisting of alkylsilanes, alkylsilane-coated titania particles, and combinations thereof. In some embodiments, the photosensitive compound forms a self-assembled monolayer (SAM) on the surface of the nanoporous template. In some embodiments, the photosensitive compound is a photoresist material, wherein the photoresist material, after exposure, requires treatment with a developer to render the exposed nanopores wettable with a precursor solution.

In some embodiments, referred to herein as "addressable array embodiments," the substrate comprises a patterned, addressable electrode array on which the template resides. In some such embodiments, the steps of activating a first portion of the nanopores and electrochemically-depositing a first material as nanorods in the first portion of activated nanopores are done simultaneously by selectively-addressing a first region of the patterned, addressable electrode array. Likewise, the steps of activating a second portion of the nanopores and electrochemically-depositing a second material as nanorods in the second portion of activated nanopores are done simultaneously by selectively-addressing a second region of the patterned, addressable electrode array.

Figure 6:
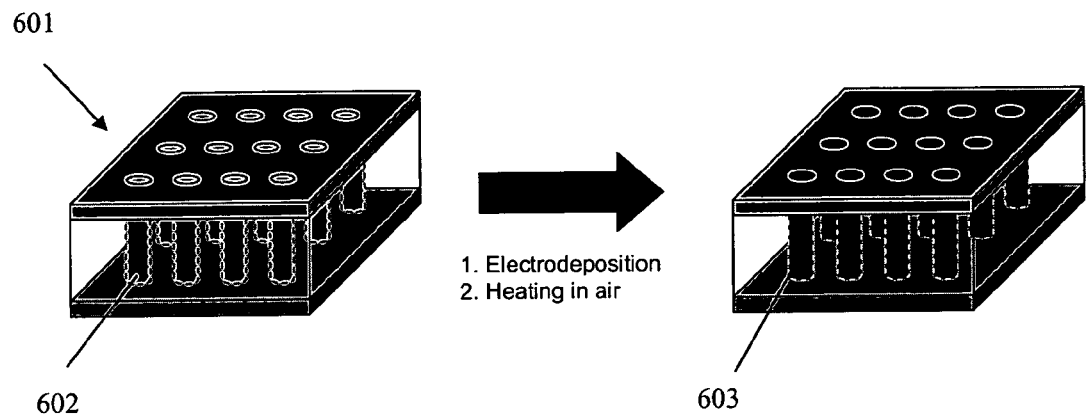
FIG. 6 depicts the electrodeposition of nanorods in a nanoporous template.
Figure 7:
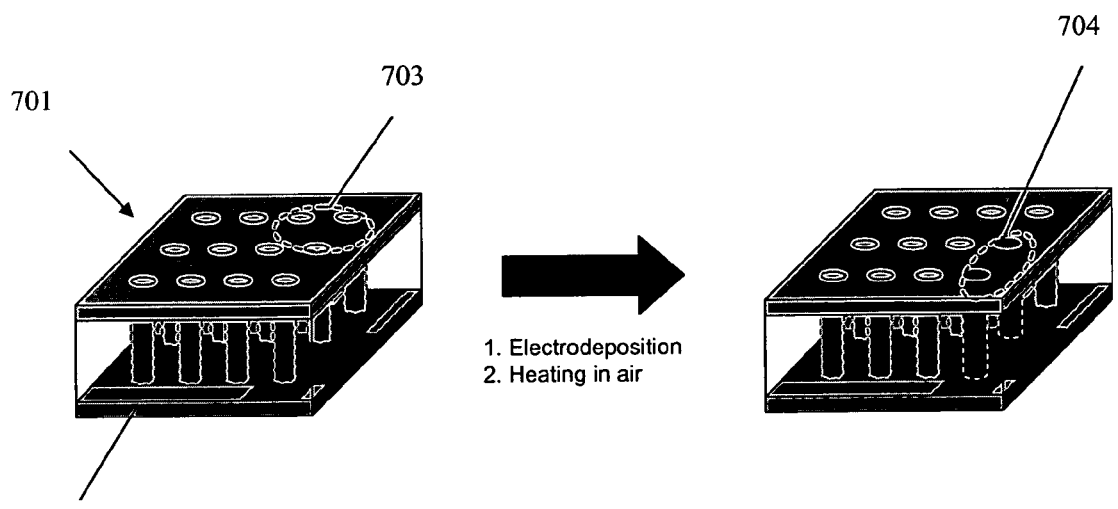
FIG. 7 depicts the selective deposition of nanorods of a first material in a nanoporous template, where the nanoporous template resides on an array of addressable electrodes, in accordance with some embodiments of the present invention.
Figure 8:
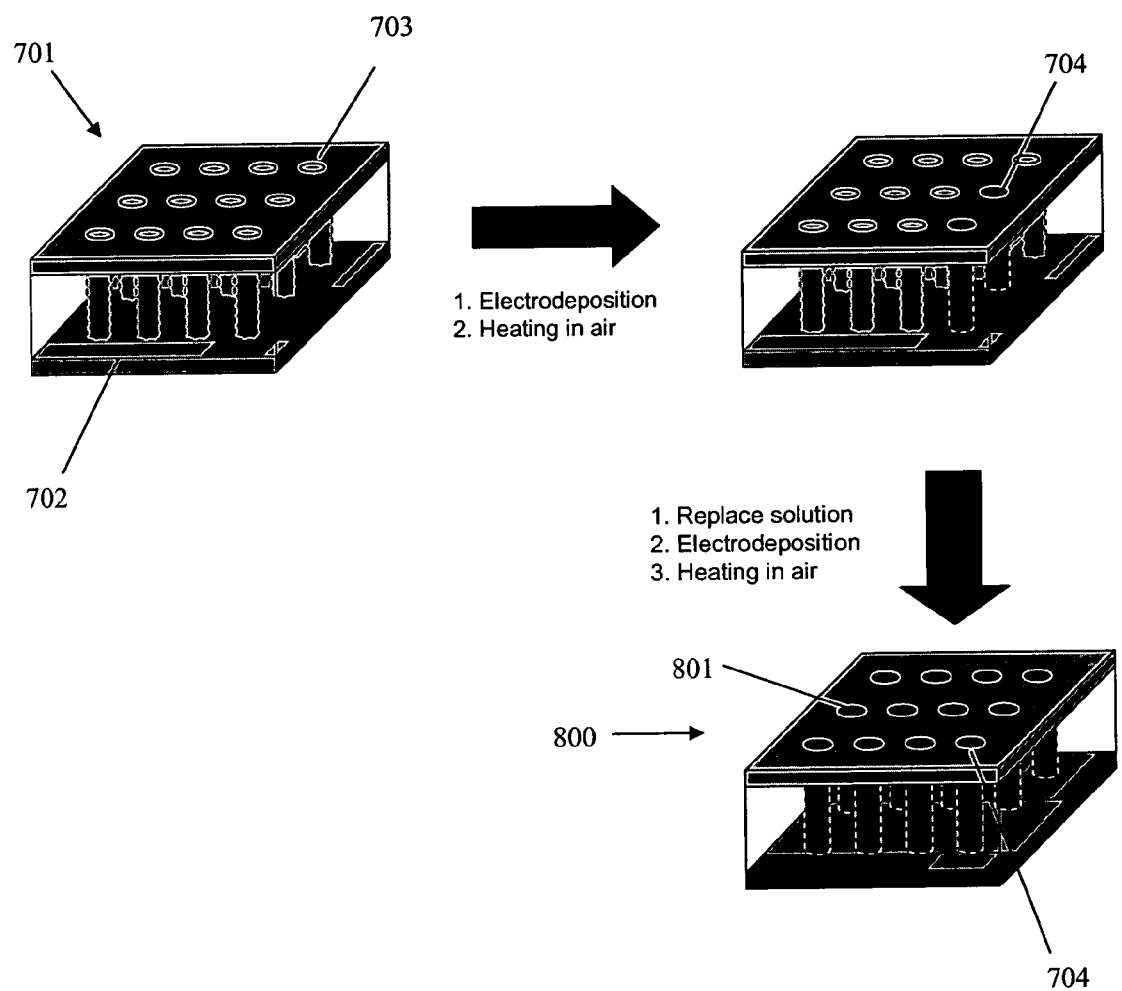
FIG. 8 depicts the deposition of nanorods of a second material in the partially-filled nanoporous template of FIG. 7, so as to form a multicomponent nanorod array, in accordance with some embodiments of the present invention.
Figure 9:
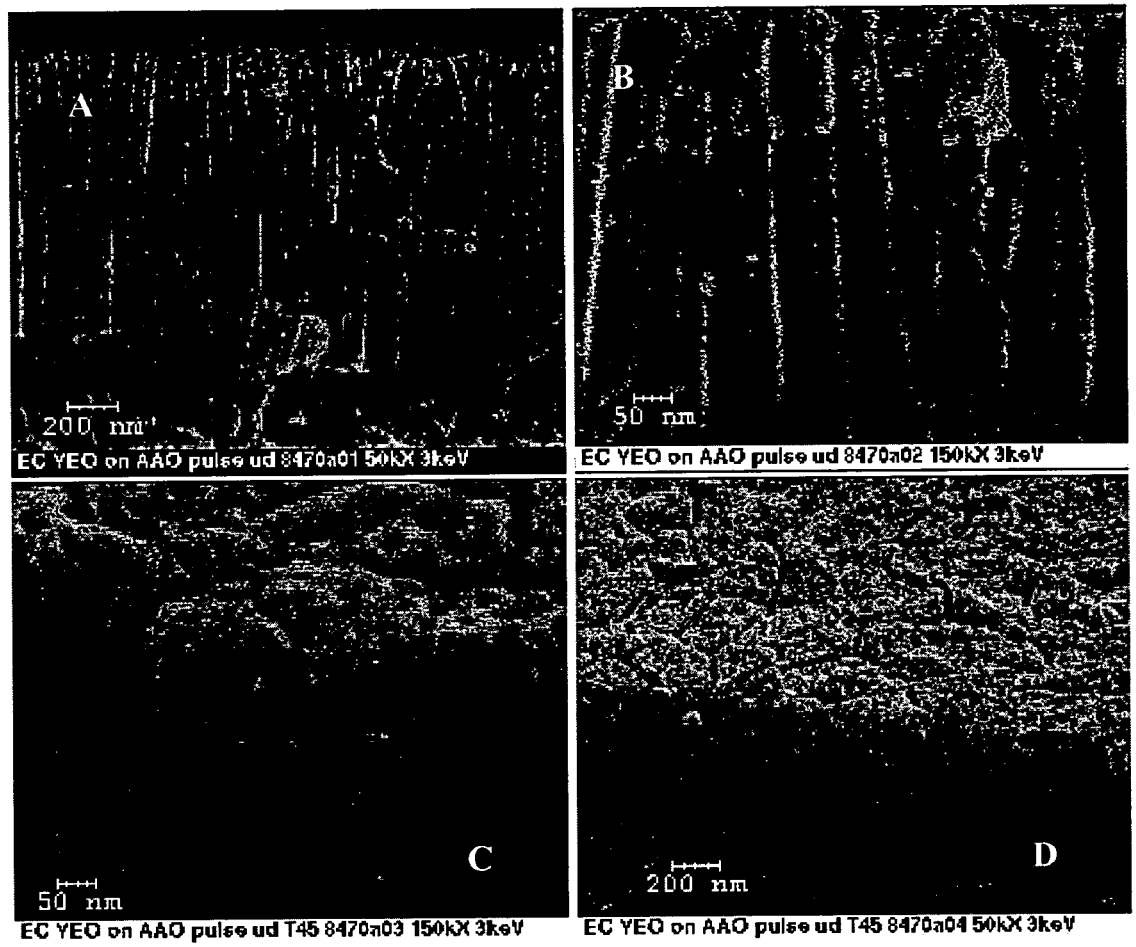
FIGS. 9(A)-9(D) are SEM images of YEO nanostructures deposited in an AAO nanoporous template using pulsed electrodeposition, in accordance with some embodiments of the present invention.

Referring to FIG. 6, nanorods 603 can be electrodeposited in nanopores 602 of a substrate-supported nanoporous template 601. Referring to FIG. 7, in the addressable array embodiments, the substrate-supported nanoporous template (701) comprises nanopores 703 and resides on a substrate 702 comprising a patterned electrode surface. By selectively addressing electrodes on the substrate 702, nanorods of a first material 704 can be selectively deposited. Referring to FIG. 8, by replacing the nanorod precursor solution and selectively addressing other electrodes on the substrate 702, nanorods 801 of a second material can be electrodeposited to form a multicomponent nanorod array 800. As in the case of the lithographic embodiments above, successive electrodepositions can be carried out, addressing different electrodes on the substrate 702 each time, to yield multicomponent nanorod arrays comprising more than two different materials. Addressable arrays of electrodes, being conceptually part of the substrate on which the nanoporous template resides, can generally be fabricated using standard lithographic methods.

Figure 10:
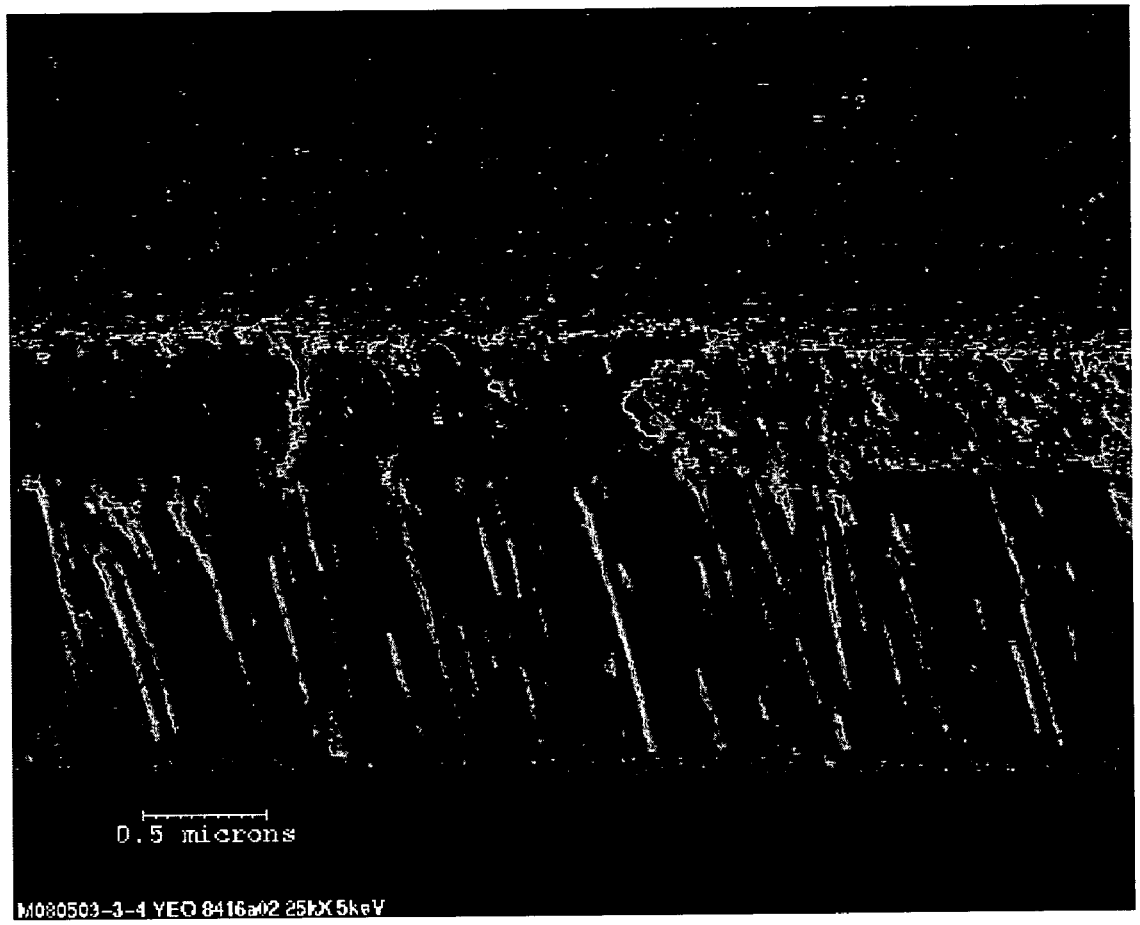
FIG. 10 is an SEM image of YEO nanostructures deposited in an AAO nanoporous template using continuous electrodeposition, in accordance with some embodiments of the present invention.

Electrochemically-depositing nanorods, in accordance with the above-described methods of the present invention can generally be done by any method that suitably provides for nanorods electrochemically-deposited in the nanopores in a manner consistent with the methods described herein. Depending upon the embodiment, electrodeposition can be done in either (or both) pulsed or continuous electrodeposition. FIGS. 9(A)-9(D) are scanning electron microscopy (SEM) images of yttrium-europium-oxide (YEO) nanostructures (nanoparticles) deposited in an AAO nanoporous template using pulsed electrodeposition, in accordance with some embodiments of the present invention. FIG. 10 is an SEM image of YEO nanostructures deposited in an AAO nanoporous template using continuous electrodeposition, in accordance with some embodiments of the present invention. Nanorods are produced when the amount of electrodeposited material is increased to a point where the nanoparticles are in contact.

In some embodiments, the steps of activating and electrochemically-depositing are done in a pre-defined manner so as to yield a patterned multicomponent nanorod array. In some or other embodiments, further activating additional portions of nanopores within the template, and electrochemically-depositing additional material into the additional portions of nanopores, can be done so as to yield multicomponent nanorod arrays comprising nanorods of more than two different chemical compositions.

In some embodiments, compositional diversity is introduced into the individual nanostructures themselves. For example, nanorods are deposited in the nanoporous template such that the nanorods comprise two or more segments of different material.

Such above-described methods lead to the fabrication of a multicomponent nanorod array comprising nanorods of at least two different chemical compositions. Generally, such nanorods have a diameter between about 10 nm and about 500 nm. More typically, the nanorods have a diameter between about 10 nm and about 200 nm. Such nanorods also typically have a height between about 20 nm and about 20 µm, and an inter-rod spacing of less than about 10 µm.

In some embodiments, the nanorods of which the multicomponent nanorod array is comprised themselves comprise material selected from the group consisting of metal, thermoelectric material, metal oxides, conductive polymers (e.g., polypyrrole, polyaniline), semiconductors (e.g., CdS, CdSe, CdTe), and the like. Additionally, such nanorods comprise further heterogeneity in a property selected from the group consisting of height, diameter, and combinations thereof, and can be arrayed in a pre-defined pattern.

In summary, methods of the present invention provide the ability to deposit nanorods of differing chemical composition, doping, diameter, and height, in a template with submicron pattern resolution. This is generally accomplished using a selective deposition technique in which some nanopores are filled first and the others are filled later. In some embodiments, such control can be accomplished, for example, by changing the pore wetting properties using a ultraviolet (UV)-patternable SAM-degradation technique, or by depositing the template on a patterned/addressable electrode array.

Embodiments using the above-mentioned UV patterning technique are generally more flexible in the sense that prefabrication of electrodes under the template is not needed. Methods of the present invention are generally compatible with existing photolithographic patterning techniques. That is, UV radiation using a photolithographic mask should produce wettable pores in the template with resolution comparable to that of conventional lithography. Additionally, the use of a photomask in this manner permits a decoupling of the patterning and deposition steps.

In some embodiments, such multicomponent nanorod arrays are operable for use as a thermoelectric device. In some such embodiments, two types of rods are present: n- and p-type. By putting these rods next to each other, one can complete an electric circuit. Additional advantages in thermoelectric performance may be realized due to the 1-D structure of the nanorods.

The following examples are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLE 1

This Example serves to illustrate the fabrication of a multicomponent nanorod array using selective photo-activation of pores within a nanoporous AAO template, in accordance with some embodiments of the present invention.

In such an embodiment, the template can be AAO, which is a film with pores (20-200 nm) oriented substantially perpendicular to the film. The template can be masked by depositing a SAM on the surface of all of the pores and selectively removing the SAM from some of the pores. This creates a membrane comprising a regions with some hydrophobic pores and regions with some hydrophilic pores, the latter of which can be selectively filled using an aqueous deposition process such as electrodeposition.

In the present example, the above template coating can be accomplished by using a UV sensitive alkylsilane as the SAM component and irradiating the AAO using UV light through a mask. This selectively removes the SAM in the irradiated region. The membrane can then be placed in an aqueous bath for electrochemical deposition. The solution only fills the irradiated pores since the pores still containing the SAM are hydrophobic. This allows patternable, selective deposition of the first material. After this deposition step, the AAO can be irradiated with UV again to remove the SAM from any or all of the remaining pores. This "opens" them for further deposition steps.

As an alternative to the above, the AAO can also be coated with a thin layer of titania onto which an alkylsilane is adsorbed. UV irradiation of the sample results in photocatalytic degradation of the alkylsilane via the titania. This leads to the same selectivity as described above.

For the above-described electrochemical deposition, the electrochemically deposited material (nanorods) can comprise a metal (e.g., Pt or Ni), a thermoelectric material (e.g., $Bi_2Te_3$), or an oxide (through cathodic electrodeposition).

EXAMPLE 2

This Example serves to illustrate the fabrication of oxide nanorods by cathodic electrodeposition on an electrode masked by a non-conducting porous template, in accordance with some embodiments of the present invention.

Generally, cathodic electrodeposition is a two-step process for preparing ceramic oxide films. The process involves placing a conductive substrate into solution containing a metal or metal complex salt. Hydroxide ions (OH—) are generated electrochemically at the substrate (cathode). The OH— locally precipitates the metal or metal complex from solution forming an insoluble hydroxide or oxyhydroxide deposit on the electrode. The substrate is subsequently heated in air to convert the deposit to an oxide film.

In this example, a cathodic substrate that is masked with a porous non-conducting template is used (FIG. 6). The pores are filled by deposition of the insoluble metal or metal complex hydroxide or oxyhydroxide. The deposit is subsequently converted into oxide nanorods by heating in air. The deposition occurs, as before, with the desired morphological control imposed by the template. The rate of OH— generation is dependent upon the electric current and must be carefully controlled to obtain nanorods. An excessively high rate of OH— production causes the formation of an overlayer on top of the template rather than filled pores (see FIG. 10). The current can be controlled by reducing the applied potential or by using electrical pulses.

The method described in this example can be used to deposit simple oxides from soluble metal salts. Complex oxides are possible in situations where the solubilities of the metal salts are comparable. This method can also be applied to the synthesis of $Y_2O_3$ and Eu-doped $Y_2O_3$. There is literature evidence that cathodic electrodeposition is suitable for the synthesis of complex oxides such as lead zirconate titanate (PZT). See Zhitomirsky, J. Mater. Sci., 1997, 32, p. 803.

The method described here can be used to selectively fill some of the pores in a template while leaving others unfilled. This is accomplished by patterning the electrode under the template. This allows selective generation of OH— only in pores with electrical contact at the bottom. FIG. 7 illustrates a configuration that would allow addressable filling of some of the pores.

The above patterned deposition can be further developed, as shown in FIG. 8. In this variation, selective deposition is performed, as illustrated in FIG. 7. The substrate is then immersed in a bath of a different metal or metal complex salt and electrodeposition is performed to fill the remaining pores. This variation allows the formation of nanorod arrays containing adjacent regions of different ceramic oxide nanorods.

EXAMPLE 3

This Example serves to illustrate the selective deposition of Pt nanorods in selected regions of a nanoporous AAO template, in accordance with some embodiments of the present invention.

In this Example, a nanoporous anodic alumina (AAO) substrate was first treated with octadecyltrichlorosilane (OTS) to render the pores hydrophobic. The substrate was then exposed to short wave UV radiation (254 nm) through a metal mask (see FIG. 11, inset) for a predetermined period of time to selectively degrade the OTS in the irradiated regions. This rendered the pores in the exposed regions hydrophilic.

Figure 11:
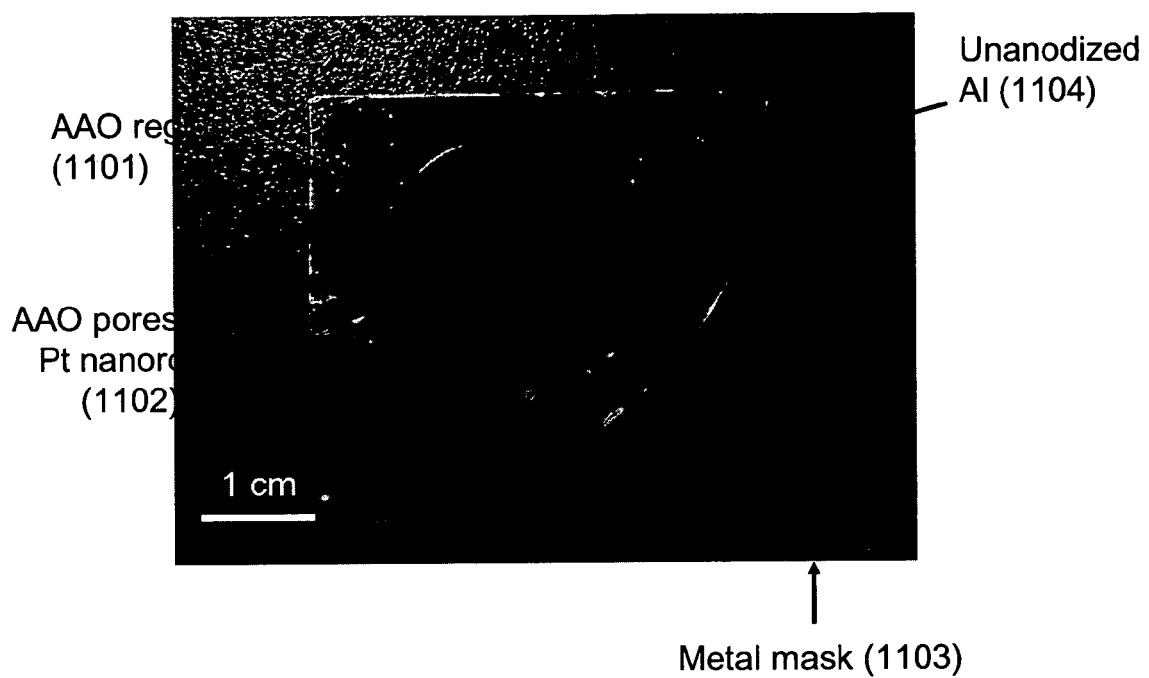
FIG. 11 is an optical plan view image of an AAO nanoporous template in which Pt nanorods have been selectively electrodeposited by first coating with photosensitive OTS and then irradiating through a metal mask, in accordance with some embodiments of the present invention.
Figure 12:
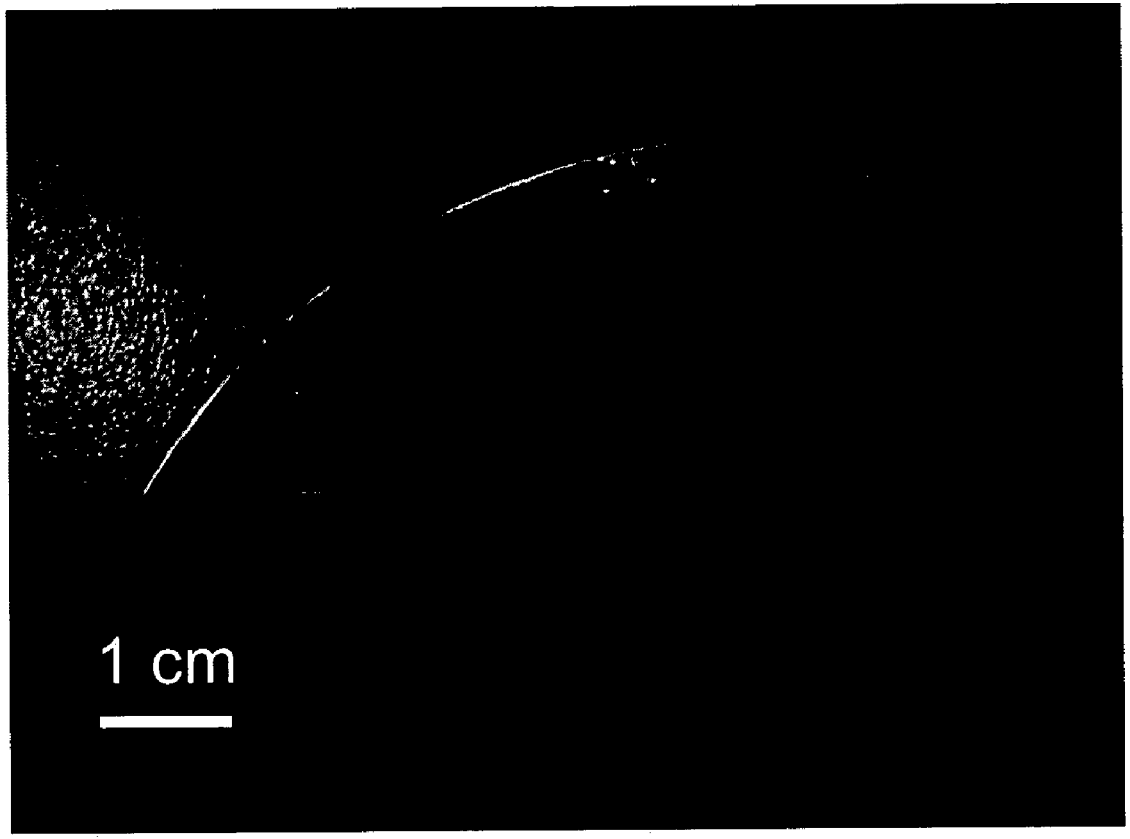
FIG. 12 is a plan view optical image of a control sample in which all of the pores are hydrophilic and have been filled with Pt nanorods (dark regions)
Figure 13:
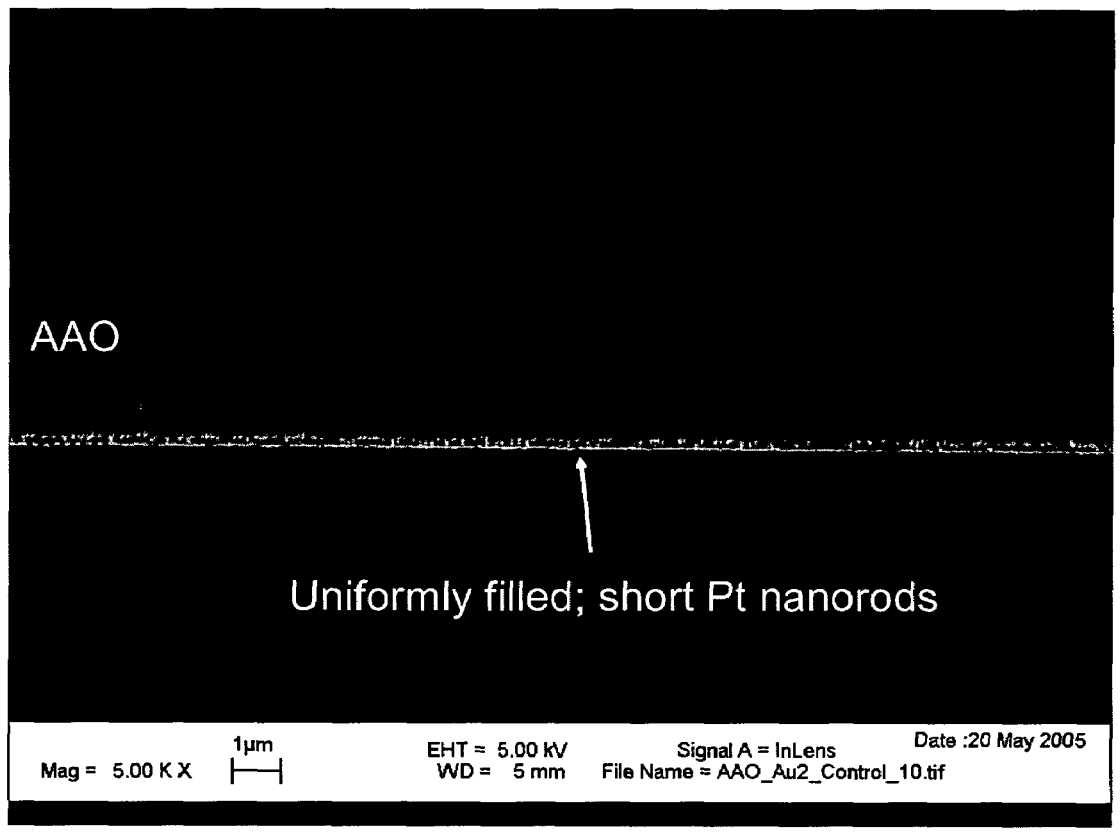
FIG. 13 is a cross-sectional SEM image of the substrate shown in FIG. 12, where uniform growth of Pt nanorods is seen within the pores.
Figure 14:
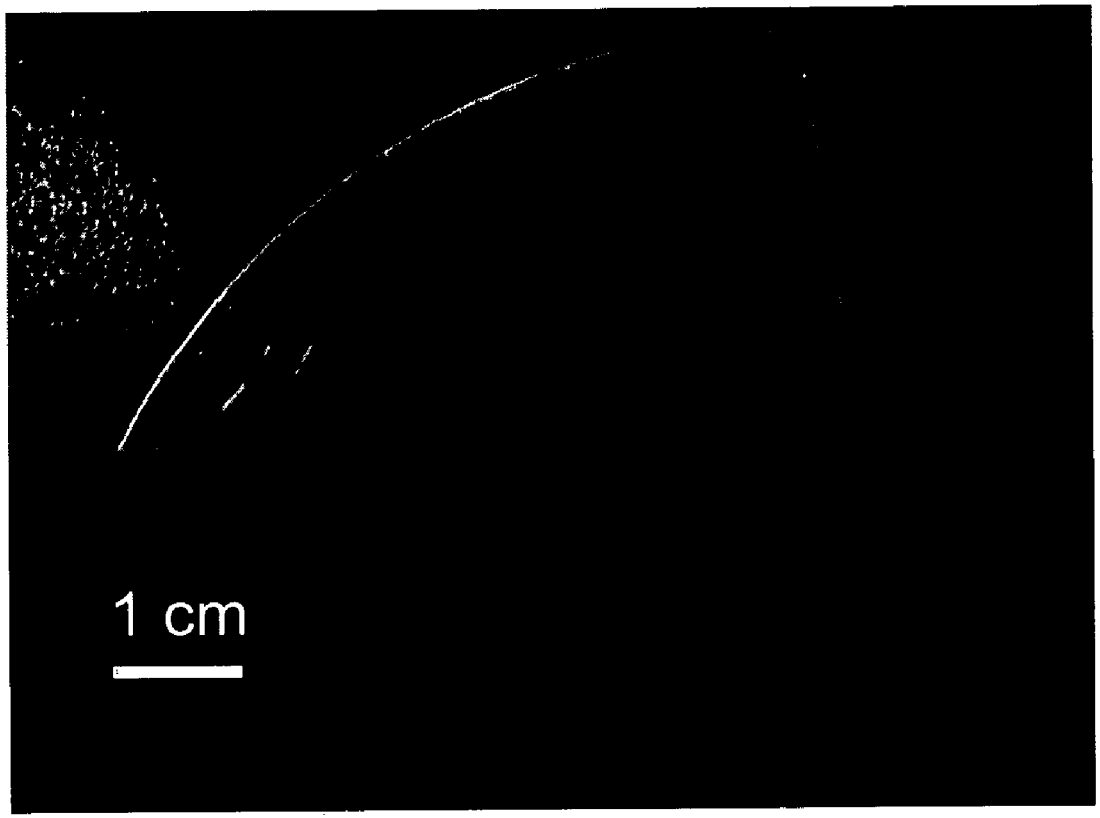
FIG. 14 is a plan view optical micrograph of a sample that has been treated with OTS to render almost all of the pores hydrophobic.
Figure 15:
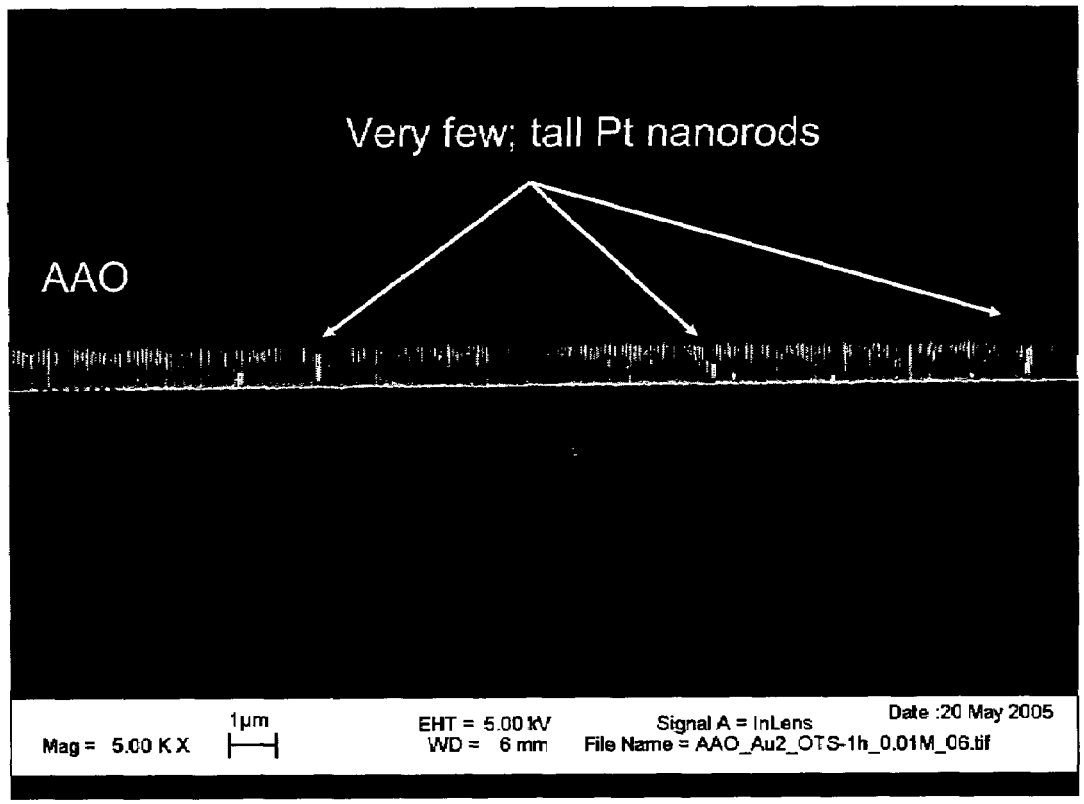
FIG. 15 is a cross-sectional SEM image of the sample shown in FIG. 14, where these pores are seen to contain very few Pt nanorods.

The patterned AAO substrate was immersed in a buffered inorganic salt plating solution containing $H_2PtCl_6$. Platinum nanorods were selectively electrodeposited in the hydrophilic pores. Electrodeposition was performed at a constant voltage of −0.6 VDC with respect to a 3 M Ag/AgCl reference electrode. FIG. 11 shows an optical plan view image of the AAO template 1101 surrounded by unanodized Al 1104, regions 1102 where Pt nanorods have been selectively deposited (dark areas), and the metal mask 1103 used in the photoactivation of the regions in which the Pt nanorods have been selectively deposited. FIG. 12 shows a plan view optical image of a control sample in which all of the pores are hydrophilic and have been filled with Pt nanorods (dark regions). FIG. 13 is a cross-sectional SEM image of the substrate shown in FIG. 12, where uniform growth of Pt nanorods is seen within the pores. FIG. 14 shows a plan view optical micrograph of a sample that has been treated with OTS to render almost all of the pores hydrophobic. FIG. 15 is a cross-sectional SEM image of the sample shown in FIG. 14, where these pores are seen to contain very few Pt nanorods. The same total charge was transferred during electrodeposition in all of the samples shown.

It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A method comprising the steps of:
   (a) providing a substrate-supported template comprising a plurality of nanopores;
   (b) activating a first portion of the nanopores to yield a first portion of activated nanopores;
   (c) electrochemically-depositing a first material as nanostructures in the first portion of activated nanopores;
   (d) activating a second portion of the nanopores to yield a second portion of activated nanopores; and
   (e) electrochemically-depositing a second material as nanostructures in the second portion of activated nanopores to yield a multicomponent array comprising nanostructures of different chemical composition.

2. The method of claim 1, wherein the nanostructures are nanorods.

3. The method of claim 2, further comprising a step of etching the template to more fully expose the nanorods formed within the nanopores.

4. The method of claim 1, wherein the nanopores are uniformly arranged in the template.

5. The method of claim 1, wherein the nanopores are arranged substantially perpendicular to the plane of the template.

6. The method of claim 1, wherein the step of activating a first portion of the nanopores further comprises the sub-steps of:
   a) coating the entire template with a photosensitive compound to form a coated template, such that the photosensitive compound coats all of the nanopores and renders them unwettable with a precursor solution used in the steps of electrochemically-depositing; and
   b) exposing the first portion of nanopores within the coated template to a form of activating radiation by irradiating through a first photomask, wherein the activating radiation modifies the photosensitive compound and renders the exposed nanopores wettable with a precursor solution.

7. The method of claim 6, wherein the step of activating a second portion of the nanopores further comprises a sub-step of exposing the second portion of the nanopores to activating radiation.

8. The method of claim 6, wherein the photosensitive compound comprises material selected from the group consisting of alkylsilanes, alkylsilane-coated titania particles and combinations thereof.

9. The method of claim 6, wherein the photosensitive compound is a photoresist material, and wherein the photoresist material, after exposure, requires treatment with a developer to render the exposed nanopores wettable with a precursor solution.

10. The method of claim 2, wherein the substrate comprises a patterned, addressable electrode array on which the template resides.

11. The method of claim 10, wherein the steps of activating a first portion of the nanopores and electrochemically-depositing a first material as nanorods in the first portion of activated nanopores are done simultaneously by selectively-addressing a first region of the patterned, addressable electrode array.

12. The method of claim 11, wherein the steps of activating a second portion of the nanopores and electrochemically-depositing a second material as nanorods in the second portion of activated nanopores are done simultaneously by selectively-addressing a second region of the patterned, addressable electrode array.

13. The method of claim 2, wherein the steps of activating and electrochemically-depositing are done in a pre-defined manner so as to yield a patterned multicomponent nanorod array.

14. The method of claim 1, wherein the template comprises nanoporous anodized aluminum oxide.

15. The method of claim 2, further comprising activating additional portions of nanopores within the template, and electrochemically-depositing additional material into the additional portions of nanopores, so as to yield multicomponent nanorod arrays comprising nanorods of more than two different chemical compositions.

16. A method comprising the steps of:
   a) providing a substrate-supported AAO template comprising a plurality of nanopores, wherein such nanopores are arranged substantially perpendicular to the plane of the AAO template;
   b) coating the entire AAO template with a photosensitive compound to form a coated AAO template, such that the photosensitive compound coats all of the nanopores and renders them unwettable with a precursor solution used in the steps of electrochemically-depositing;
   c) exposing a first portion of nanopores within the coated template to a form of activating radiation by irradiating through a first photomask, wherein the activating radiation modifies the photosensitive compound and renders the exposed nanopores wettable with a precursor solution to yield a first portion of activated nanopores;
   d) electrochemically-depositing a first material as nanorods in the first position of activated nanopores;
   e) exposing a second portion of nanopores within the coated template to a form of activating radiation be irradiating through a second photomask, wherein the activating radiation modifies the photosensitive compound and renders the exposed nanopores wettable with a precursor solution to field a second portion of activated nanopores; and
   f) electrochemically-depositing a second material as nanorods in the second portion of activated nanopores to yield a multicomponent nanorod array comprising nanorods of different chemical composition.

17. The method of claim 16, further comprising a step of etching the template to more fully expose the nanorods formed within the nanopores.

18. The method of claim 16, wherein the photosensitive compound comprises material selected from the group consisting of alkylsilanes, alkylsilane-coated titania particles, and combinations thereof.

19. The method of claim 16, wherein the photosensitive compound is a photoresist material, and wherein the photoresist material, after exposure, requires treatment with a developer to render the exposed nanopores wettable with a precursor solution.

20. The method of claim 16, wherein the steps of activating and electrochemically-depositing are done in a pre-defined manner so as to yield a patterned multicomponent nanorod array.

21. The method of claim 16, further comprising activating additional portions of nanopores within the AAO template, and electrochemically-depositing additional material into the additional portions of nanopores, so as to yield multicomponent nanorod arrays comprising nanorods of more than two different chemical compositions.

22. A multicomponent nanorod array comprising nanorods of at least two different chemical compositions, wherein the nanorods are arrayed in a pre-defined pattern, and wherein the nanorods are disposed on the surface of an unpatterned electrically conductive substrate.

23. The multicomponent nanorod array of claim 22, wherein the nanorods have a diameter between about 10 nm and about 500 nm.

24. The multicomponent nanorod array of claim 22, wherein the nanorods have a diameter between about 10 nm and about 200 nm.

25. The multicomponent nanorod array of claim 22, wherein the nanorods have a height between about 20 nm and about 20 μm.

26. The multicomponent nanorod array of claim 22, wherein the inter-rod spacing is less than about 10 μm.

27. The multicomponent nanorod array of claim 22, wherein the nanorods comprise material selected from the group consisting of metal, thermoelectric material, metal oxides, conductive polymers, semiconductors, and combinations thereof.

28. The multicomponent nanorod array of claim 22, wherein the nanorods comprise further heterogeneity in a property selected from the group consisting of height, diameter, and combinations thereof.

* * * * *

UNITED STATES PATENT AND TRADEMARK OFFICE
CERTIFICATE OF CORRECTION

| | | |
|---|---|---|
| PATENT NO. | : 7,686,885 B2 | Page 1 of 1 |
| APPLICATION NO. | : 11/142799 | |
| DATED | : March 30, 2010 | |
| INVENTOR(S) | : Ku et al. | |

It is certified that error appears in the above-identified patent and that said Letters Patent is hereby corrected as shown below:

In Column 10, Line 58, in Claim 16, delete "be" and insert -- by --, therefor.

Signed and Sealed this

Fifteenth Day of June, 2010

David J. Kappos
*Director of the United States Patent and Trademark Office*